(12) United States Patent
Kwon

(10) Patent No.: US 12,222,398 B2
(45) Date of Patent: Feb. 11, 2025

(54) SENSING APPARATUS AND METHOD

(71) Applicant: LG ENERGY SOLUTION, LTD., Seoul (KR)

(72) Inventor: Jung-Hyun Kwon, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 152 days.

(21) Appl. No.: 18/014,285

(22) PCT Filed: Nov. 3, 2021

(86) PCT No.: PCT/KR2021/015824
§ 371 (c)(1),
(2) Date: Jan. 3, 2023

(87) PCT Pub. No.: WO2022/098095
PCT Pub. Date: May 12, 2022

(65) Prior Publication Data
US 2023/0251320 A1 Aug. 10, 2023

(30) Foreign Application Priority Data
Nov. 3, 2020 (KR) .................. 10-2020-0145421

(51) Int. Cl.
*G01R 31/3835* (2019.01)
*H01M 10/48* (2006.01)
*H02J 7/00* (2006.01)

(52) U.S. Cl.
CPC ........ *G01R 31/3835* (2019.01); *H01M 10/48* (2013.01); *H02J 7/00032* (2020.01); *H02J 7/0045* (2013.01); *H02J 7/0047* (2013.01)

(58) Field of Classification Search
CPC .............. G01R 33/00; G01R 33/0035; G01R 33/0023; G01R 33/0017; G01R 31/3191;
(Continued)

(56) References Cited

U.S. PATENT DOCUMENTS

2010/0060434 A1 3/2010 Shiotsu et al.
2016/0077159 A1* 3/2016 Petrucelli ............... G01R 1/025
324/426
(Continued)

FOREIGN PATENT DOCUMENTS

JP 2009-236629 A 10/2009
JP 4992971 B2 8/2012
(Continued)

OTHER PUBLICATIONS

International Search Report for PCT/KR2021/015824 mailed on Feb. 25, 2022.
(Continued)

*Primary Examiner* — Jermele M Hollington
*Assistant Examiner* — Taqi R Nasir
(74) *Attorney, Agent, or Firm* — Birch, Stewart, Kolasch & Birch, LLP

(57) ABSTRACT

Discussed is a sensing apparatus that can include a voltage measuring unit configured to measure a voltage of a battery when a power is supplied thereto, an environment information measuring unit configured to measure environment information for the battery when power is supplied thereto, a connector unit configured to output a first connection signal when connected to the battery and output a second connection signal when connected to an external battery management system (BMS), a power unit configured to supply power to at least one of the voltage measuring unit and the environment information measuring unit according to an operation mode, and a control unit configured to control the operation mode of the power unit based on which of the first connection signal and the second connection signal is received from the connector unit and residual amount information of the power unit.

14 Claims, 4 Drawing Sheets

(58) Field of Classification Search
CPC ............ G01R 33/0358; G01R 33/0356; G01R 33/0206; G01R 33/0082; G01R 33/022; G01B 7/004; G01C 17/38; G06F 3/017; G06F 3/0346; G06F 3/012; H01L 39/223
See application file for complete search history.

(56) References Cited

U.S. PATENT DOCUMENTS

| | | |
|---|---|---|
| 2017/0133729 A1* | 5/2017 | Reitzle .................. G01K 13/00 |
| 2017/0356963 A1 | 12/2017 | Petrucelli |
| 2018/0101208 A1 | 4/2018 | Kamijima |
| 2018/0217208 A1 | 8/2018 | Park et al. |
| 2018/0372802 A1 | 12/2018 | Petrucelli |
| 2019/0170829 A1 | 6/2019 | Srinivasan et al. |
| 2020/0058965 A1 | 2/2020 | Kim |
| 2021/0325472 A1 | 10/2021 | Lee et al. |
| 2021/0376396 A1 | 12/2021 | Burns et al. |

FOREIGN PATENT DOCUMENTS

| | | |
|---|---|---|
| JP | 5980132 B2 | 8/2016 |
| JP | 2019-46679 A | 3/2019 |
| KR | 10-2015-0086736 A | 7/2015 |
| KR | 10-2016-0058276 A | 5/2016 |
| KR | 10-1748916 B1 | 6/2017 |
| KR | 10-2018-0084523 A | 7/2018 |
| KR | 10-1974015 B1 | 5/2019 |
| KR | 10-2020-0032739 A | 3/2020 |
| KR | 10-2116720 B1 | 5/2020 |
| KR | 10-2167429 B1 | 10/2020 |
| WO | WO2016/040823 A1 | 3/2016 |
| WO | WO 2017/022169 A | 2/2017 |

OTHER PUBLICATIONS

European Search Report for European Application No. 21889560.5, dated Feb. 28, 2024.

* cited by examiner

SENSING APPARATUS AND METHOD

TECHNICAL FIELD

The present application claims priority to Korean Patent Application No. 10-2020-0145421 filed on Nov. 3, 2020 in the Republic of Korea, the disclosures of which are incorporated herein by reference.

The present disclosure relates to a sensing apparatus and method, and more particularly, to a sensing apparatus and method capable of measuring voltage information of a battery and environment information of the battery.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

A battery model using machine learning is being researched so as to be used for battery state estimation or the like. However, in order to improve the accuracy of the battery model, high-quality data is required, and such high-quality data may include continuous battery-related information. For example, if the battery-related information may be continuously measured in the battery manufacturing stage, the battery shipment stage and the battery operation stage, a battery model with high accuracy may be generated.

However, there is a practical difficulty in continuously measuring and storing battery-related information in the entire life cycle of the battery. Therefore, a device capable of measuring battery-related information independently of a BMS (Battery Management System) is required.

DISCLOSURE

Technical Problem

The present disclosure is designed to solve the problems of the related art, and therefore the present disclosure is directed to providing a sensing apparatus and method capable of continuously measuring and storing a voltage of a battery and environment information of the battery.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A sensing apparatus according to one aspect of the present disclosure may include: a voltage measuring unit configured to measure a voltage of a battery when power is supplied thereto; an environment information measuring unit configured to measure environment information for the battery when power is supplied thereto; a connector unit configured to output a first connection signal when being connected to the battery and output a second connection signal when being connected to an external battery management system (BMS); a power unit configured to supply power to at least one of the voltage measuring unit and the environment information measuring unit according to an operation mode; and a control unit configured to control the operation mode of the power unit based on which of the first connection signal and the second connection signal is received from the connector unit and residual amount information of the power unit.

The control unit may be configured to control the operation mode of the power unit to a power supply mode or a sleep mode based on whether the first connection signal is received, whether the second connection signal is received, and the residual amount information.

The power supply mode may be an operation mode in which power is supplied to at least one of the voltage measuring unit and the environment information measuring unit.

The sleep may be is an operation mode in which power is not supplied to the voltage measuring unit and the environment information measuring unit.

The control unit may be configured to check a residual amount of the power unit, when the control unit receives at least one of the first connection signal and the second connection signal.

The control unit may be configured to control the operation mode of the power unit to a first power supply mode so that power is supplied to the environment information measuring unit, when the control unit receives the first connection signal and the second connection signal, and when the residual amount of the power unit is equal to or greater than a preset threshold value.

The control unit may be configured to control the operation mode of the power unit to a second power supply mode so that power is supplied to the voltage measuring unit and the environment information measuring unit, when the control unit receives only the first connection signal, and when the residual amount of the power unit is equal to or greater than a preset threshold value.

The control unit may be configured to control the operation mode of the power unit to the sleep mode, when the residual amount of the power unit is less than a preset threshold value.

The control unit may be configured to connect a power path from the voltage measuring unit and the environment information measuring unit to the battery so that the voltage measuring unit and the environment information measuring unit are supplied with power from the battery, when the control unit receives only the first connection signal and controls the operation mode of the power unit to the sleep mode.

The control unit may be configured to control the operation mode of the power unit to the power supply mode, when the residual amount of the power unit is recovered to the preset threshold value or more.

The control unit may be configured to block the power path, when the operation mode of the power unit is the power supply mode and the power path is connected.

A sensing apparatus according to another aspect of the present disclosure may further include a communication unit configured to receive a communication packet from outside at every predetermined cycle.

The control unit may be configured to select an available communication network by checking the communication packet, and output the voltage information about the voltage of the battery measured by the voltage measuring unit and the environment information measured by the environment information measuring unit along the communication network through the communication unit.

The environment information measuring unit may be configured to measure at least one of temperature, humidity and a location of the battery.

A battery pack according to still another aspect of the present disclosure may include the sensing apparatus according to one aspect of the present disclosure.

A sensing method according to still another aspect of the present disclosure may include: a connection signal receiving operation of receiving at least one of a first connection signal representing whether a connector unit is connected to a battery and a second connection signal representing whether the connector unit is connected to an external battery management system (BMS); a power unit residual amount checking operation of checking a residual amount of a power unit, when at least one of the first connection signal and the second connection signal is received in the connection signal receiving operation; a power unit operation mode controlling operation of controlling an operation mode of the power unit based on at least one of the first connection signal and the second connection signal received in the connection signal receiving operation and the residual amount of the power unit; and a measuring operation of measuring at least one of a voltage of the battery and environment information for the battery according to the operation mode of the power unit.

Advantageous Effects

According to one aspect of the present disclosure, the sensing apparatus appropriately controls the operation mode of the power unit by considering whether it is connected to a battery and a BMS and the residual amount of the power unit, and thus there is an advantage of efficiently using the limited resources of the power unit and continuously measuring the voltage and/or environment information of the battery.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, terms such as a control unit described in the specification mean a unit that processes at least one function or operation, which may be implemented as hardware or software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
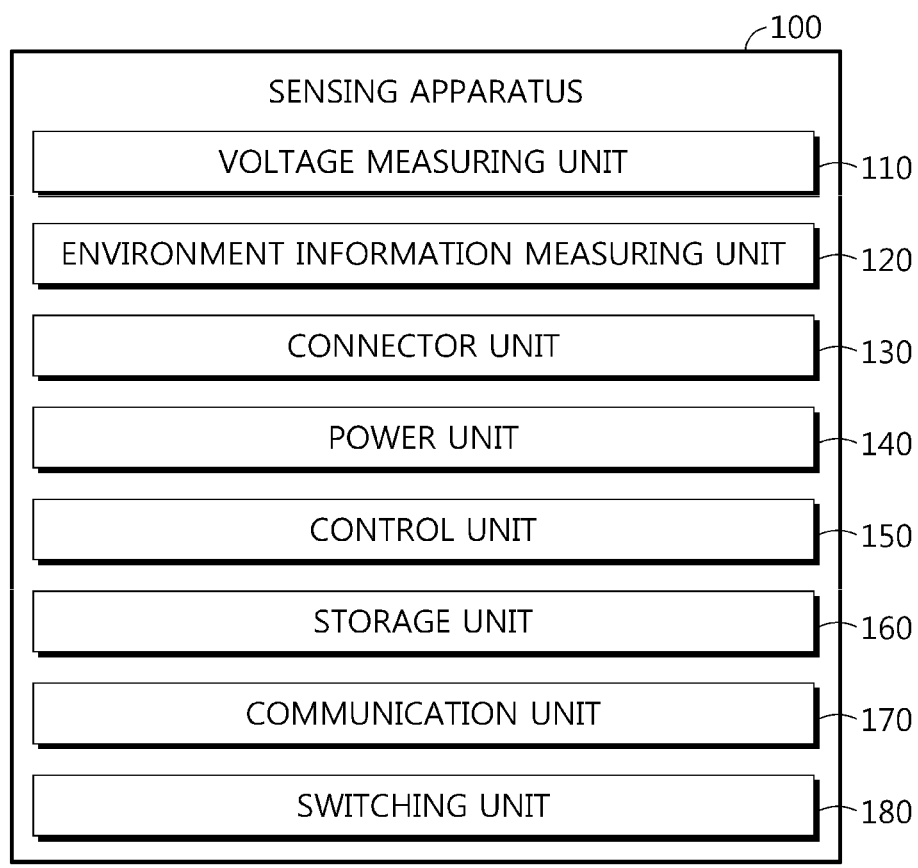
FIG. 1 is a diagram schematically showing a sensing apparatus according to an embodiment of the present disclosure.

FIG. 1 is a diagram schematically showing a sensing apparatus 100 according to an embodiment of the present disclosure.

Referring to FIG. 1, the sensing apparatus 100 according to an embodiment of the present disclosure may include a voltage measuring unit 110, an environment information measuring unit 120, a connector unit 130, a power unit 140, and a control unit 150.

The voltage measuring unit 110 may be configured to measure a voltage of a battery 10 when a power is supplied thereto.

Here, the battery 10 may mean a single independent cell that has a negative electrode terminal and a positive electrode terminal and is physically separable. For example, one pouch-type lithium polymer cell may be regarded as a battery 10. Also, the battery 10 may be a battery module in which a plurality of cells are connected in series and/or in parallel. Hereinafter, for convenience of explanation, the battery 10 will be described as meaning an independent cell.

Preferably, the sensing apparatus 100 may be provided to each battery 10. In addition, the voltage measuring unit 110 may measure the voltage of the corresponding battery 10 when a power is supplied thereto. For example, the voltage measuring unit 110 may measure an open circuit voltage (OCV) of the battery 10.

The environment information measuring unit 120 may be configured to measure environment information about the battery 10 when a power is supplied thereto.

For example, the environment information measuring unit 120 may be configured to measure at least one of temperature, humidity and location of the battery 10. Preferably, the environment information measuring unit 120 may measure the temperature of the battery 10, the ambient humidity of the battery 10, and the GPS (Global positioning system) location of the battery 10.

Here, the voltage measuring unit 110 and the environment information measuring unit 120 are independent of each other, and may be supplied with a power independently from each other. That is, the power may be independently supplied to the voltage measuring unit 110 and/or the environment information measuring unit 120.

For example, when a power is supplied only to the voltage measuring unit 110, the voltage of the battery 10 may be measured and the environment information about the battery 10 may not be measured. Conversely, when a power is supplied only to the environment information measuring unit 120, the environment information about the battery 10 may be measured, and the voltage of the battery 10 may not be measured.

The connector unit 130 may be configured to output a first connection signal when being connected to the battery 10. In addition, the connector unit 130 may be configured to output a second connection signal when being connected to an external BMS 20.

For example, the connector unit 130 may output the first connection signal and the second connection signal to the control unit 150. Accordingly, the control unit 150 may detect whether the connector unit 130 is connected to the battery 10 and/or the BMS 20 based on the connection signal received from the connector unit 130.

Figure 2:
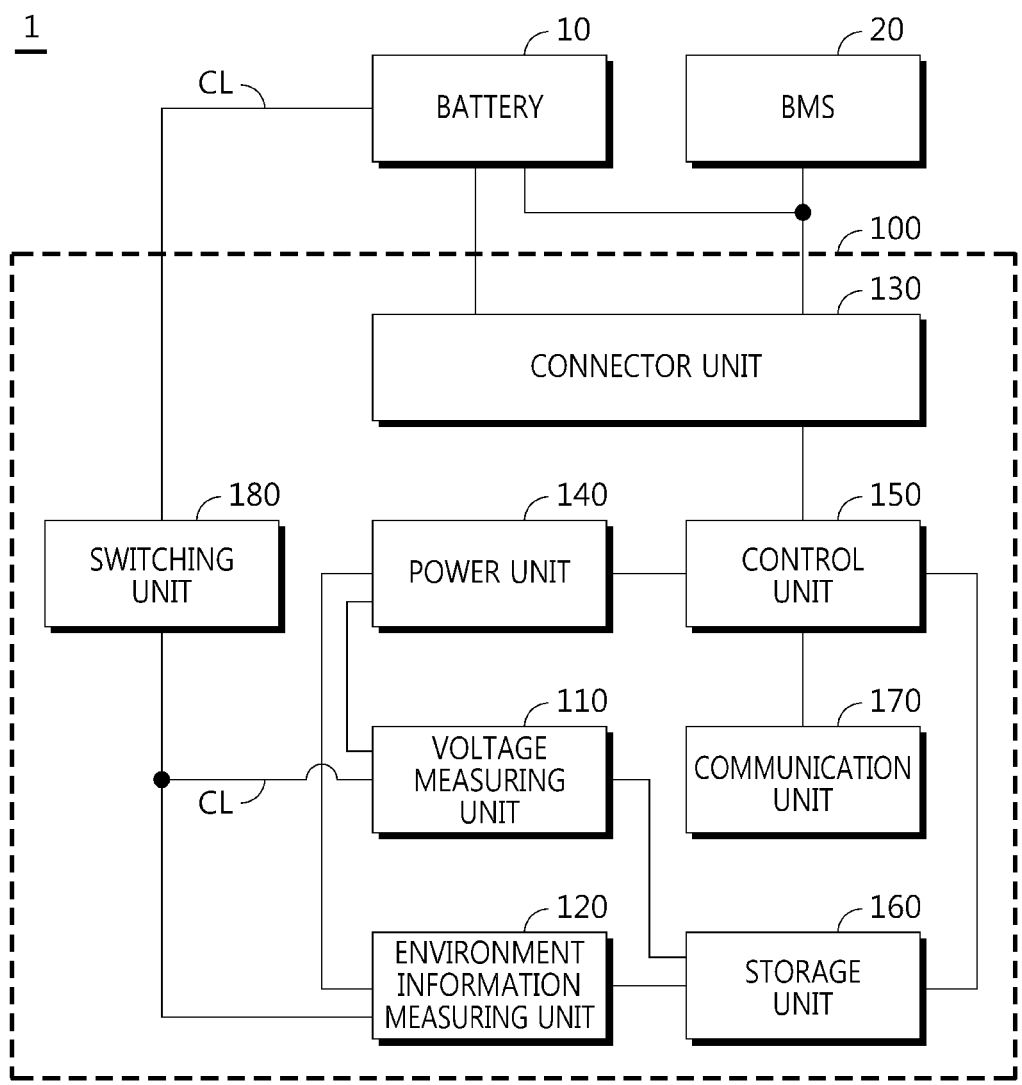
FIG. 2 is a diagram schematically showing an embodiment of a battery pack including the sensing apparatus according to an embodiment of the present disclosure.

FIG. 2 is a diagram schematically showing an embodiment of a battery pack 1 including the sensing apparatus 100 according to an embodiment of the present disclosure.

Specifically, FIG. 2 shows an embodiment in which both the battery 10 and the BMS 20 are connected to the connector unit 130. In the embodiment of FIG. 2, the connector unit 130 may output the first connection signal and the second connection signal to the control unit 150. In addition, the control unit 150 that has received both the first connection signal and the second connection signal may determine that both the battery 10 and the BMS 20 are connected to the connector unit 130.

Figure 3:
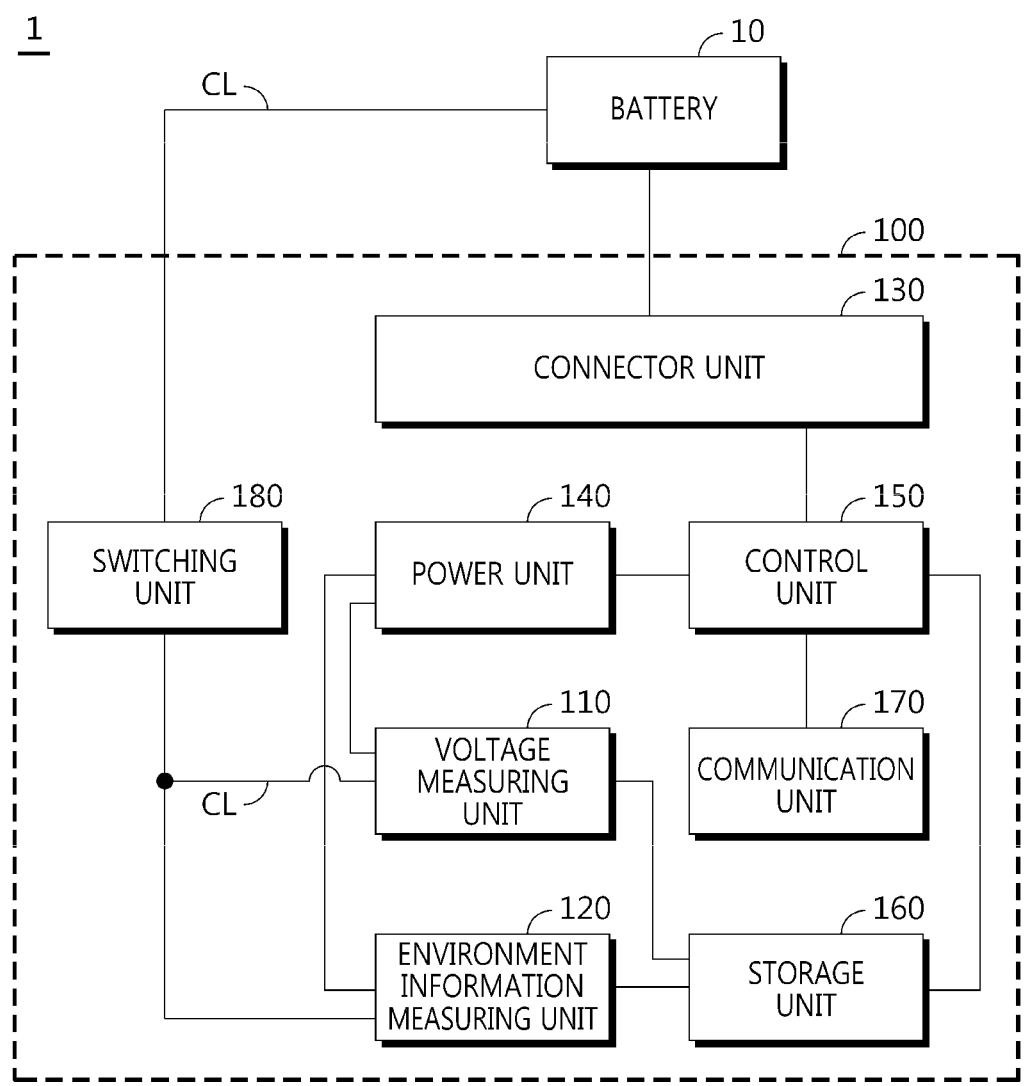
FIG. 3 is a diagram schematically showing another embodiment of the battery pack including the sensing apparatus according to an embodiment of the present disclosure.

FIG. 3 is a diagram schematically showing another embodiment of the battery pack 1 including the sensing apparatus 100 according to an embodiment of the present disclosure.

Specifically, FIG. 3 shows an embodiment in which only the battery 10 is connected to the connector unit 130 and the BMS 20 is not connected. In the embodiment of FIG. 3, the connector unit 130 may output only the first connection signal to the control unit 150. In addition, the control unit 150 that has received only the first connection signal may determine that only the battery 10 is connected to the connector unit 130 and that the BMS 20 is not connected.

Also, referring to FIGS. 2 and 3, when the BMS 20 is connected to the connector unit 130, the BMS 20 may also be connected to the battery 10. In other words, when the BMS 20 is connected to the battery 10, the BMS 20 may also be connected to the connector unit 130. Conversely, when the BMS 20 is not connected to the connector unit 130 or the battery 10, both the connection between the BMS 20 and the connector unit 130 and the connection between the BMS 20 and the battery 10 may be released. That is, when receiving the second connection signal from the connector unit 130, the control unit 150 may detect not only whether the BMS 20 and the connector unit 130 are connected, but also whether the BMS 20 and the battery 10 are connected.

The power unit 140 may be configured to supply a power to at least one of the voltage measuring unit 110 and the environment information measuring unit 120 according to an operation mode.

For example, the operation mode of the power unit 140 may include a power supply mode and a sleep mode. The power supply mode may be an operation mode in which a power may be supplied to at least one of the voltage measuring unit 110 and the environment information measuring unit 120, and the sleep mode may be an operation mode in which a power is not supplied to the voltage measuring unit 110 and the environment information measuring unit 120. That is, the sleep mode may be an operation mode in which the power unit 140 is idle with respect to the voltage measuring unit 110 and the environment information measuring unit 120.

Meanwhile, preferably, the power unit 140 supplies a power to the voltage measuring unit 110 and the environment information measuring unit 120 according to the operation mode, and may also supply a predetermined voltage to each component included in the sensing apparatus 100.

The control unit 150 may be configured to control the operation mode of the power unit 140 based on the connection signal received from the connector unit 130 and residual amount information of the power unit 140. That is, the control unit 150 may control the operation mode of the power unit 140 to the power supply mode or the sleep mode based on whether the first connection signal is received, whether the second connection signal is received, and the residual amount information.

First, the control unit 150 may be configured to check a residual amount of the power unit 140 when receiving at least one of the first connection signal and the second connection signal.

For example, the power unit 140 may transmit the residual amount information to the control unit 150. Here, the residual amount information may be a SOC (State of Charge) of the power unit 140.

Hereinafter, an embodiment in which the control unit 150 controls the operation mode of the power unit 140 according to whether the first connection signal and the second connection signal are received and the residual amount of the power unit 140 will be described in detail.

For example, when the control unit 150 receives the first connection signal and the second connection signal and the residual amount of the power unit 140 is equal to or greater than a preset threshold value, the control unit 150 may be configured to control the operation mode of the unit 140 to the first power supply mode so that a power is supplied to the environment information measuring unit 120.

Here, the preset threshold value may be a residual amount that requires charging or replacement of the power unit 140. For example, the threshold value may be set to SOC 10% or less for the power unit 140. More preferably, the threshold value may be set to SOC 5% for the power unit 140.

In the embodiment of FIG. 2, since both the battery 10 and the BMS 20 are connected to the connector unit 130, the control unit 150 may receive both the first connection signal and the second connection signal from the connector unit 130. In this case, as described above, the battery 10 and the BMS 20 may also be connected to each other. Therefore, the control unit 150 may control the operation mode of the power unit 140 to the first power supply mode so that the power unit 140 supplies a power only to the environment information measuring unit 120 in order to efficiently use the limited resources of the power unit 140. That is, the voltage of the battery 10 may be measured by the BMS 20, and the environment information about the battery 10 may be measured by the environment information measuring unit 120 supplied with a power by the power unit 140.

As another example, when the control unit 150 receives only the first connection signal and the residual amount of the power unit 140 is equal to or greater than the preset threshold value, the control unit 150 may be configured to control the operation mode of the power unit 140 to the second power supply mode so that a power is supplied to the voltage measuring unit 110 and the environment information measuring unit 120.

In the embodiment of FIG. 3, the battery 10 is connected to the connector unit 130, but the BMS 20 is not connected to the battery 10 and the connector unit 130, so the control unit 150 may receive only the first connection signal from the connector unit 130.

The case where the BMS 20 is not connected to the battery 10 and the connector unit 130 may include the case where the BMS 20 is not provided in the battery pack 1 and the case where the BMS 20 operates in the sleep mode to release the connection with the battery 10 and the connector unit 130. That is, not only when the BMS 20 is absent, but also when the connection between the battery 10 and the connector is released according to the operation mode of the BMS 20, the control unit 150 may receive only the first connection signal from the connector unit 130.

The control unit 150 may apply a power to the voltage measuring unit 110 and the environment information measuring unit 120 by controlling the operation mode of the power unit 140 to the second power supply mode so that the voltage and environment information for the battery 10 may be continuously measured.

That is, when the BMS 20 is connected to the battery 10 and the connector unit 130 as in the embodiment of FIG. 2, the control unit 150 controls the power unit 140 to the first power supply mode in order to efficiently use the limited resources of the power unit 140, but, when the BMS 20 is not connected to the battery 10 and the connector unit 130 as in the embodiment of FIG. 3, the power unit 140 may be controlled to the second power supply mode so that the voltage of the battery 10 may be continuously measured. Accordingly, even when the BMS 20 is not connected to the battery 10, the voltage of the battery 10 may be continuously measured.

As another example, when the residual amount of the power unit 140 is less than the preset threshold value, the control unit 150 may be configured to control the operation mode of the power unit 140 to a sleep mode.

In the embodiment of FIGS. 2 and 3, even when the connection signal is received from the connector unit 130, the control unit 150 may control the operation mode of the power unit 140 to the sleep mode, if the residual amount of the power unit 140 is less than the threshold value. In this case, the control unit 150 may output an alarm for requesting charging or replacement of the power unit 140 to the outside in order to induce continuous measurement of the voltage and/or environment information of the battery 10.

That is, the sensing apparatus 100 according to an embodiment of the present disclosure has an advantage of continuously measuring the voltage and/or environment information of the battery 10 while using the limited resources of the power unit 140 efficiently by controlling the operation mode of the power unit 140 in consideration of whether being connected to the battery 10 and the BMS 20 and the residual amount of the power unit 140.

Meanwhile, the control unit 150 provided to the sensing apparatus 100 may optionally include a processor, an application-specific integrated circuit (ASIC), another chipset, a logic circuit, a register, a communication modem, and a data processing device, and the like, known in the art to execute various control logics performed in the present disclosure. In addition, when the control logic is implemented in software, the control unit 150 may be implemented as a set of program modules. At this time, the program module may be stored in a memory and executed by the control unit 150. The memory may be provided in or out of the control unit 150, and may be connected to the control unit 150 by various well-known means.

In addition, the sensing apparatus 100 may further include a storage unit 160. The storage unit 160 may store data or programs necessary for operation and function of each component of the sensing apparatus 100, data generated in the process of performing the operation or function, or the like. The storage unit 160 is not particularly limited in its kind as long as it is a known information storage means that can record, erase, update and read data. As an example, the information storage means may include RAM, flash memory, ROM, EEPROM, registers, and the like. In addition, the storage unit 160 may store program codes in which processes executable by the control unit 150 are defined.

For example, the storage unit 160 may store the voltage information of the battery measured by the voltage measuring unit 110 and the environment information about the battery 10 measured by the environment information measuring unit 120.

When the control unit 150 receives only the first connection signal and controls the operation mode of the power unit 140 to the sleep mode, the control unit 150 may be configured to connect a power path CL from the voltage measuring unit 110 and the environment information measuring unit 120 to the battery 10 so that the voltage measuring unit 110 and the environment information measuring unit 120 is supplied with a power from the battery 10.

For example, in the embodiment of FIG. 3, it is assumed that the residual amount of the power unit 140 is less than a threshold value. Since the battery 10 and the connector unit 130 are connected, the control unit 150 may receive the first connection signal from the connector unit 130. However, since the residual amount of the power unit 140 is less than the threshold value, the control unit 150 may control the operation mode of the power unit 140 to the sleep mode. In this case, both the measurement of the voltage and the measurement of the environment information of the battery 10 may be stopped. Accordingly, the control unit 150 may connect the power path CL between the battery 10 and the voltage measuring unit 110 and the power path CL between the battery 10 and the environment information measuring unit 120, so that the voltage measuring unit 110 and the environment information measuring unit 120 is supplied with a power from the battery 10.

Specifically, in the embodiment of FIG. 3, the control unit 150 may electrically connect the battery 10 to the voltage measuring unit 110 and the environment information measuring unit 120 by controlling the operating state of the switching unit 180 provided on the power path CL to a turn-on state. In addition, the voltage measuring unit 110 may receive the power from the battery 10 and measure the voltage of the battery 10. In addition, the environment information measuring unit 120 may receive the power from the battery 10 and measure the environment information about the battery 10.

For example, according to an embodiment of the present disclosure, the voltage information and the environment information of the battery 10 may be continuously measured and stored while the battery 10 is being produced and shipped. That is, the sensing apparatus 100 has an advantage of continuously acquiring the voltage information and the environment information of the battery 10 even when the BMS 20 is absent, by efficiently using the limited resources of the power unit 140 and the resources of the battery 10.

Therefore, since the voltage information and the environment information of the battery 10 may be continuously obtained in the entire cycles of the battery 10, the model of the battery 10 for estimating the state of the battery 10 based on the battery 10-related information (voltage information and environment information) may be easily generated. In addition, the battery 10-related information may be usefully used when tracking the history of the state of the battery 10.

The control unit 150 may be configured to control the operation mode of the power unit 140 to the power supply model, when the residual amount of the power unit 140 is recovered to the threshold value or more.

That is, when the control unit 150 connects the power path CL by controlling the operation state of the switching unit 180 to a turn-on state, the voltage measuring unit 110 and the environment information measuring unit 120 may receive a power from the battery 10. In this case, since the battery 10 is continuously being discharged, the control unit 150 may control the operation mode of the power unit 140 to the power supply mode when the residual amount of the power unit 140 is recovered to the threshold value or more. Preferably, the control unit 150 may control the operation mode of the power unit 140 to the second power supply mode, so that the voltage measuring unit 110 and the environment information measuring unit 120 receive a power from the power unit 140.

In addition, the control unit 150 may be configured to block the power path CL, when the operation mode of the power unit 140 is the power supply mode and the power path CL is connected. For example, the control unit 150 may control the operation state of the switching unit 180 to a turn-off state to block the electrical connection between the battery 10 and the voltage measuring unit 110 and the environment information measuring unit 120. Even in this case, since the voltage measuring unit 110 and the environment information measuring unit 120 may receive a power from the power unit 140, the information related to the battery 10 may be continuously measured and stored.

That is, in the absence of BMS 20, even when the residual amount of the power unit 140 is less than the threshold value, the voltage measuring unit 110 and the environment information measuring unit 120 may receive a power from the battery 10 and measure the information related to the battery 10. Thereafter, when the residual amount of the power unit 140 is recovered, the control unit 150 may block the power path CL connected to the battery 10, thereby preventing the battery 10 from being unnecessarily discharged.

Referring to FIG. 1, the sensing apparatus 100 may further include a communication unit 170.

The communication unit 170 may be configured to receive a communication packet from the outside at every predetermined cycle. In addition, the communication unit 170 may transmit the received communication packet to the control unit 150.

The control unit 150 may be configured to select an available communication network by checking the communication packet.

For example, the communication network may include a wired network and/or a wireless network. Specifically, the wireless network may include LTE (Long Term Evolution), WiFi, Bluetooth, a preset sensor network, and a preset IoT (Internet of Things) network.

The control unit 150 may be configured to output the voltage information about the voltage of the battery 10 measured by the voltage measuring unit 110 and the environment information measured by the environment information measuring unit 120 along the communication network through the communication unit 170.

For example, the capacity of the storage unit 160 included in the sensing apparatus 100 may be limited. When the total amount of the measured voltage information and the measured environment information is greater than the capacity of the storage unit 160 while the battery 10 is produced and shipped, there is a problem that the voltage information and the environment information about the battery 10 may be lost.

Accordingly, the control unit 150 may periodically select an available communication network based on the communication packet received from the communication unit 170 and output the voltage information and the environment information for the battery 10 according to the selected communication network. That is, the control unit 150 may store the voltage information and the environment information of the battery 10 in an external server (e.g., a cloud server).

Preferably, the control unit 150 may set a cycle in which the communication unit 170 receives the communication packet, so that the communication network may be selected when the total amount of the voltage information and the environment information stored in the storage unit 160 is equal to or greater than the predetermined level.

For example, the communication unit 170 may also receive a power through the power unit 140. That is, even when the communication unit 170 receives the communication packet and the voltage information and the environment information are output, the resources of the power unit 140 may be consumed. Accordingly, the control unit 150 may more efficiently utilize the resources of the power unit 140 by setting a predetermined cycle so that the communication unit 170 may receive the communication packet when the voltage information and the environment information of a predetermined level or above are stored in the storage unit 160.

The BMS 20 may be connected to the connector unit 130 and the battery 10 according to an embodiment of the present disclosure. The BMS 20 may be connected to the battery 10 and measure the voltage of the battery 10. In addition, the BMS 20 connectable to the connector unit 130 and the battery 10 may be implemented by supplementing or adding functions of components included in a conventional BMS 20.

In addition, the sensing apparatus 100 according to the present disclosure may be provided to a battery pack 1. That is, the battery pack 1 according to the present disclosure may include at least one battery and the above-described sensing apparatus 100. In addition, the battery pack 1 may include a BMS 20. In addition, the battery pack 1 may further include electrical equipment (a relay, a fuse, etc.) and a case.

For example, in the embodiment of FIG. 2, the battery pack 1 may include the battery 10, the BMS 20, and the sensing apparatus 100. The battery 10 and the BMS 20 may be connected to the connector unit 130 of the sensing apparatus 100. When the battery 10 is connected to the connector unit 130, the connector unit 130 may transmit the first connection signal to the control unit 150. Also, when the BMS 20 is connected to the connector unit 130, the connector unit 130 may transmit the second connection signal to the control unit 150.

As another example, in the embodiment of FIG. 3, the battery pack 1 may include the battery 10 and the sensing apparatus 100. The battery 10 may be connected to the connector unit 130 of the sensing apparatus 100. When the battery 10 is connected to the connector unit 130, the connector unit 130 may transmit the first connection signal to the control unit 150. However, since the BMS 20 is not included in the battery pack 1, the connector unit 130 cannot transmit the second connection signal to the control unit 150.

Figure 4:
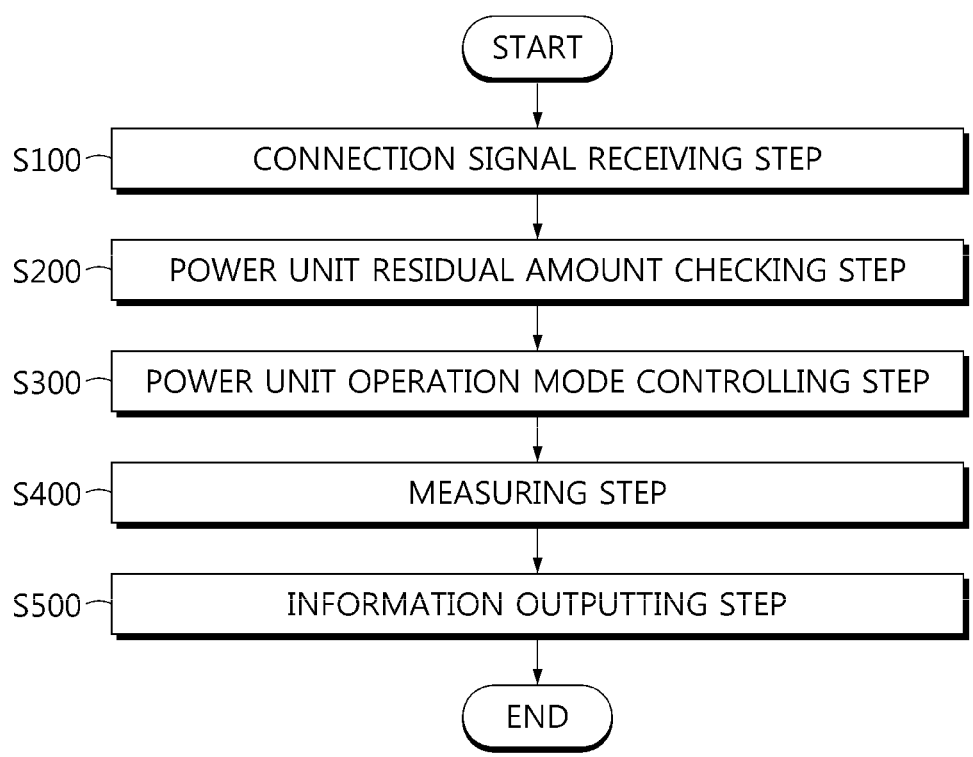
FIG. 4 is a diagram showing a sensing method according to another embodiment of the present disclosure.

FIG. 4 is a diagram showing a sensing method according to another embodiment of the present disclosure.

Here, each step of the sensing method may be performed by the sensing apparatus 100. Hereinafter, for convenience of explanation, content overlapping with the previously described content will be omitted or briefly described.

Referring to FIG. 4, the sensing method may include a connection signal receiving step (S100), a power unit residual amount checking step (S200), a power unit operation mode controlling step (S300), and a measuring step (S400).

The connection signal receiving step (S100) is a step of receiving at least one of a first connection signal representing whether being connected to the battery 10 and a second connection signal representing whether being connected to the external BMS 20, and may be performed by the control unit 150.

Specifically, the connector unit 130 of the sensing apparatus 100 may transmit the first connection signal to the control unit 150 when being connected to the battery 10, and transmit the second connection signal to the control unit 150 when being connected to the BMS 20.

The power unit residual amount checking step (S200) is a step of checking a residual amount of the power unit 140, when at least one of the first connection signal and the second connection signal is received in the connection signal receiving step (S100), and may be performed by the control unit 150.

Specifically, when the control unit 150 receives the first connection signal and/or the second connection signal, the control unit 150 may check the residual amount of the power unit 140.

For example, if the control unit 150 does not receive both the first connection signal and the second connection signal, this may be a state where the sensing apparatus 100 is not connected to both the battery 10 and the BMS 20. In this case, since the power unit 140 does not need to supply a power to the voltage measuring unit 110 and the environment information measuring unit 120, the control unit 150 may not check the residual amount of the power unit 140.

The power unit operation mode controlling step (S300) is a step of controlling an operation mode of the power unit 140 based on the connection signal received in the connection signal receiving step (S100) and the residual amount of the power unit 140, and may be performed by the control unit 150.

For example, when the control unit 150 receives the first connection signal and the second connection signal from the connector unit 130 and the residual amount of the power unit 140 is equal to or greater than a threshold value, the control unit 150 may control the operation mode of the power unit 140 to a first power supply mode to supply a power to the environment information measuring unit 120.

As another example, when the control unit 150 receives only the first connection signal from the connector unit 130 and the residual amount of the power unit 140 is equal to or greater than the threshold value, the control unit 150 may control the operation mode of the unit 140 to a second power supply mode to supply a power to the voltage measuring unit 110 and the environment information measuring unit 120.

As still another example, when the control unit 150 receives the first connection signal and/or the second connection signal from the connector unit 130 but the residual amount of the power unit 140 is less than the threshold value, the control unit 150 may control the operation mode of the unit 140 to a sleep mode.

In particular, when the control unit 150 receives only the first connection signal but the residual amount of the power unit 140 is less than the threshold value, the control unit 150 may connect a power path CL by controlling the operation state of the switching unit 180 to a turn-on state so that the voltage measuring unit 110 and the environment information measuring unit 120 may receive a power from the battery 10.

The measuring step (S400) is a step of measuring at least one of the voltage of the battery 10 and the environment information about the battery 10 according to the operation mode of the power unit 140, and may be performed by the voltage measuring unit 110 and the environment information measuring unit 120.

For example, the voltage measuring unit 110 may measure the voltage of the battery 10 when a power is supplied thereto. In addition, the environment information measuring unit 120 may measure temperature, humidity and location of the battery 10 when a power is supplied thereto.

Also, referring to FIG. 4, the sensing method may further include an information output step (S500) after the measuring step (S400).

The information outputting step (S500) is a step of outputting the measured voltage and environment information of the battery 10 to the outside, and may be performed by the control unit 150 and the communication unit 170.

For example, the communication unit 170 may receive a communication packet from the outside at every predetermined cycle. In addition, the control unit 150 may select an available communication network by checking the communication packet, and output the voltage information of the battery 10 measured by the voltage measuring unit 110 and the environment information about the battery 10 measured by the environment information measuring unit 120 along the communication network through the communication unit 170.

That is, the sensing method according to another embodiment of the present disclosure has an advantage of effectively measuring the voltage information and the environment information of the battery 10 using the limited resources of the power unit 140 by appropriately controlling the operation mode of the power unit 140 according to whether being connected to the battery 10 and the BMS 20 and the residual amount of the power unit 140.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
10: battery
20: BMS
100: sensing apparatus
110: voltage measuring unit
120: environment information measuring unit
130: connector unit
140: power unit
150: control unit
160: storage unit
170: communication unit
180: switching unit
CL: power path

What is claimed is:

1. A sensing apparatus, comprising:
a voltage measuring unit configured to measure a voltage of a battery when power is supplied thereto;
an environment information measuring unit configured to measure environment information for the battery when power is supplied thereto;
a connector unit configured to output a first connection signal when being connected to the battery and output a second connection signal when being connected to an external battery management system (BMS);
a power unit configured to supply power to at least one of the voltage measuring unit and the environment information measuring unit according to an operation mode; and
a control unit configured to control the operation mode of the power unit based on which of the first connection signal and the second connection signal is received from the connector unit and residual amount information of the power unit,
wherein the control unit is configured to control the operation mode of the power unit to a power supply mode or a sleep mode based on whether the first connection signal is received, whether the second connection signal is received, and the residual amount information.

2. The sensing apparatus according to claim 1,
wherein the power supply mode is an operation mode in which power is supplied to at least one of the voltage measuring unit and the environment information measuring unit, and
wherein the sleep mode is an operation mode in which power is not supplied to the voltage measuring unit and the environment information measuring unit.

3. The sensing apparatus according to claim 2,
wherein the control unit is configured to check a residual amount of the power unit, when the control unit receives at least one of the first connection signal and the second connection signal.

4. The sensing apparatus according to claim 2,
wherein the control unit is configured to control the operation mode of the power unit to a first power supply mode so that power is supplied to the environment information measuring unit, when the control unit receives the first connection signal and the second connection signal, and when the residual amount of the power unit is equal to or greater than a preset threshold value.

5. The sensing apparatus according to claim 2,
wherein the control unit is configured to control the operation mode of the power unit to a second power supply mode so that power is supplied to the voltage measuring unit and the environment information measuring unit, when the control unit receives only the first connection signal, and when the residual amount of the power unit is equal to or greater than a preset threshold value.

6. The sensing apparatus according to claim 2,
wherein the control unit is configured to control the operation mode of the power unit to the sleep mode, when the residual amount of the power unit is less than a preset threshold value.

7. The sensing apparatus according to claim 6,
wherein the control unit is configured to connect a power path from the voltage measuring unit and the environment information measuring unit to the battery so that the voltage measuring unit and the environment information measuring unit are supplied with power from the battery, when the control unit receives only the first connection signal and controls the operation mode of the power unit to the sleep mode.

8. The sensing apparatus according to claim 7,
wherein the control unit is configured to control the operation mode of the power unit to the power supply mode, when the residual amount of the power unit is recovered to the preset threshold value or more.

9. The sensing apparatus according to claim 8,
wherein the control unit is configured to block the power path, when the operation mode of the power unit is the power supply mode and the power path is connected.

10. The sensing apparatus according to claim 1, further comprising:
a communication unit configured to receive a communication packet from outside at every predetermined cycle,
wherein the control unit is configured to select an available communication network by checking the communication packet, and output the voltage information about the voltage of the battery measured by the voltage measuring unit and the environment information measured by the environment information measuring unit along the communication network through the communication unit.

11. The sensing apparatus according to claim 1,
wherein the environment information measuring unit is configured to measure at least one of temperature, humidity and a location of the battery.

12. A battery pack, comprising the sensing apparatus according to claim 1.

13. A sensing method, comprising:
a connection signal receiving operation of receiving at least one of a first connection signal representing whether a connector unit is connected to a battery and a second connection signal representing whether the connector unit is connected to an external battery management system (BMS);
a power unit residual amount checking operation of checking a residual amount of a power unit, when at least one of the first connection signal and the second connection signal is received in the connection signal receiving operation;
a power unit operation mode controlling operation of controlling an operation mode of the power unit based on at least one of the first connection signal and the second connection signal received in the connection signal receiving operation and the residual amount of the power unit to operate in a power supply mode or a sleep mode based on whether the first connection signal is received, whether the second connection signal is received, and the residual amount information; and
a measuring operation of measuring at least one of a voltage of the battery and environment information for the battery according to the operation mode of the power unit.

14. The sensing method according to claim 13,
wherein the power supply mode is an operation mode in which power is supplied to at least one of a voltage measuring unit that is configured to measure the voltage of the battery and the environment information measuring unit that is configured to measure the environmental information, and
wherein the sleep mode is an operation mode in which power is not supplied to the voltage measuring unit and the environment information measuring unit.

* * * * *